United States Patent

Meissner

[11] Patent Number: 5,846,638
[45] Date of Patent: *Dec. 8, 1998

[54] COMPOSITE OPTICAL AND ELECTRO-OPTICAL DEVICES

[75] Inventor: Helmuth E. Meissner, Pleasanton, Calif.

[73] Assignee: Onyx Optics, Inc., Dublin, Calif.

[*] Notice: The term of this patent shall not extend beyond the expiration date of Pat. No. 5,441,803.

[21] Appl. No.: 580,730

[22] Filed: Dec. 29, 1995

Related U.S. Application Data

[60] Continuation-in-part of Ser. No. 330,174, Oct. 27, 1994, abandoned, which is a division of Ser. No. 919,374, Jul. 29, 1992, Pat. No. 5,441,803, which is a continuation of Ser. No. 672,251, Mar. 20, 1991, abandoned, which is a continuation-in-part of Ser. No. 597,987, Oct. 15, 1990, abandoned, which is a continuation of Ser. No. 446,214, Dec. 5, 1989, abandoned, which is a division of Ser. No. 238,563, Aug. 30, 1988, abandoned.

[51] Int. Cl.$^6$ .............................. B32B 31/00; C30B 33/00
[52] U.S. Cl. ................... 428/220; 117/1; 148/DIG. 12; 148/DIG. 135; 156/153; 156/281; 437/225; 437/921; 437/974; 428/408; 428/411.1; 428/700
[58] Field of Search .................... 117/1; 156/281, 156/153, 154, 87; 228/231, 234; 437/225, 974, 921; 148/DIG. 12, DIG. 135

[56] References Cited

U.S. PATENT DOCUMENTS

| | | |
|---|---|---|
| 3,123,953 | 3/1964 | Merkl . |
| 3,565,508 | 2/1971 | DuMont . |
| 3,880,632 | 4/1975 | Podvigalkina . |
| 4,149,902 | 4/1979 | Mauer et al. . |
| 4,509,175 | 4/1985 | Daly et al. . |
| 4,531,809 | 7/1985 | Carter et al. . |
| 4,638,552 | 1/1987 | Shimbo et al. . |
| 4,671,846 | 6/1987 | Shimbo et al. . |
| 4,810,318 | 3/1989 | Haisma et al. . |
| 4,983,251 | 1/1991 | Haisma et al. . |
| 5,013,380 | 5/1991 | Aoshima .............................. 156/264 X |
| 5,201,977 | 4/1993 | Aoshima .............................. 156/281 X |
| 5,441,803 | 8/1995 | Meissner . |

FOREIGN PATENT DOCUMENTS

| | | |
|---|---|---|
| 0136050 | 5/1984 | European Pat. Off. . |
| 0232935 | 1/1987 | European Pat. Off. . |
| 0456060 | 11/1991 | European Pat. Off. ................ 117/1 |
| 5255000 | 10/1993 | Japan ....................................... 117/1 |

OTHER PUBLICATIONS

Webster's Third New International Dictionary, 1961, p. 1584.

McLellan, G. W., *Glass Engineering Handbook*, Third Edition, pp. 1–1 to 1–3 and 4–4 to 4–11.

Van Bueren, et al., "A Small Stable Continuous Gas Laser," *Physics Letters*, vol. 2, No. 7, 2 Nov. 1962, pp. 310–341.

(List continued on next page.)

*Primary Examiner*—Jeff H. Aftergut
*Attorney, Agent, or Firm*—David G. Beck; Townsend and Townsend and Crew LLP

[57] ABSTRACT

A method of forming defect-free permanent bonds without the use of adhesives as well as devices formed by this method is disclosed. In general, the disclosed process allows similar or dissimilar crystalline, vitreous or dense polycrystalline ceramic, metallic or organic polymeric components to be first joined by optical contacting and then heat treated to stabilize the bond. The heat treatment can be performed at a low enough temperature to prevent interdiffusion between species, thus insuring that the bond is not subjected to excessive mechanical stresses and that the materials do not undergo phase changes. Therefore stable bonds can be formed using the disclosed process between materials of widely differing physical, mechanical, thermal, optical and electro-optical properties such as different hardness, chemical durability, mechanical strength, coefficients of thermal expansion, thermal conductivity, crystal structure, refractive indices, optical birefringence, nonlinear optical coefficients, electrical conductivity, or semiconducting properties.

15 Claims, 8 Drawing Sheets

OTHER PUBLICATIONS

Haisma, J., et al., "Silicon–on–Insulator Wafer Bonding–Wafer Bonding Thinning Technolgical Evaluations," *Japanese Journal of Applied Physics*, vol. 28, No. 8, Aug. 1989, pp. 1426–1443.

Black R.D., et al., "Silicon and silicon dioxide thermal bonding for silicon–on–insulator applications," *J. Appl. Phys.* 63(8), 15 Apr. 1988, pp. 2773–2777.

Webster's New Collegiate Dictionary, 1977, p. 46.

Furukawa, K., et al., "Lattice Configuration and Electrical Properties at the Interface of Direct Bonded Silicon," Extended Abstracts of the 18th (1986 Internal) Conference on Solid State Devices and Materials, Tokyo, 1986, pp. 533–536.

S.R. Bowman, et al., *Power Scaling of Diode–Pumped 2–Micron Lasers,* LEOS '93. Nov. 15–18, 1993. 34 pgs.

H.C. Lee, et al. *Diffusion Bonded Composites of YAG Single Crystals.* SPIE, vol. 1624, 1991. Laser–Induced Damage in Optical Materials. Pp. 2–10.

H.C. Lee, et al., *Single Crystal Composites for EO Applications,* Optics in Montana '91: Topical Meeting on CTH:YAG. vol. 1. Aug. 13–15, 1991, 12 pgs.

Onyx Optics. *Design Features and Applications of ONYX OPtics' Crystal Composites* (A product description). Released May 1994. 3 pgs.

H.F. Fischmeister, et al. *Preparation, Properties and Structure of Metal/Oxide Interfaces.* Mat. Res. Soc. Symp. Proc. vol. 122, 1988. pp. 529–540.

Hidemi Tajima, et al. *Performance of Composite Glass Slab Laser.* IEEE J. of Quantum Electronics. vol. 28, No. 6, Jun. 1992. pp. 1562–1570.

C.T. Yen et al. *On Controlled Solidification Studies of Some $TiO_2$ Binary Alloys.* J. Mater. Res. vol. 7, No. 4, Apr. 1992. Pp. 980–991.

STEP 110 →

STEP 112 →

STEP 114 →

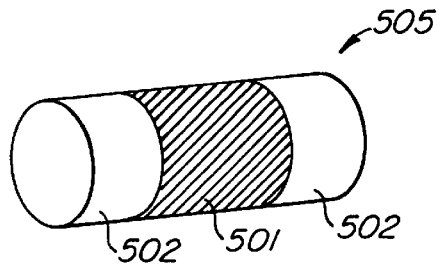
FIG. 5A.
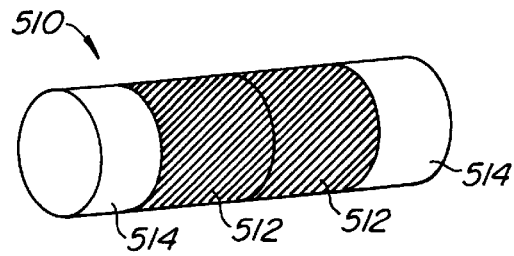
FIG. 5B.
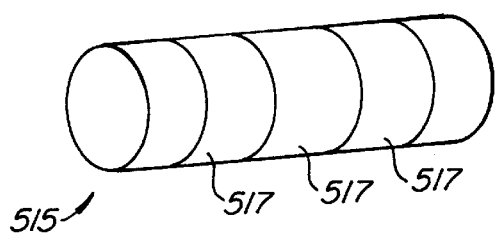
FIG. 5C.
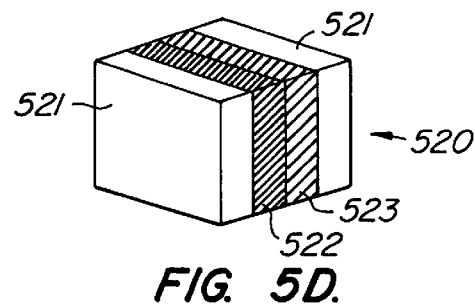
FIG. 5D.
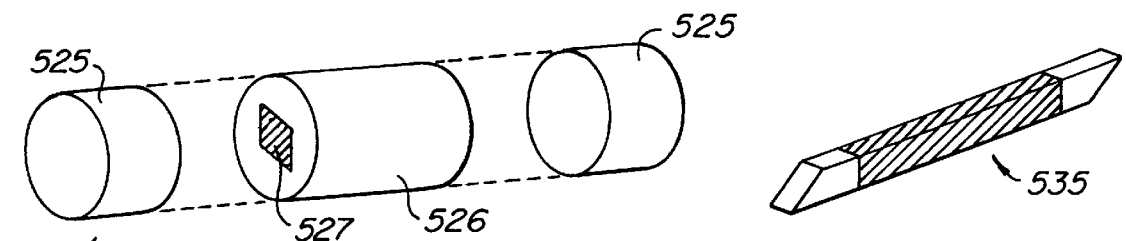
FIG. 5E.
FIG. 5F.
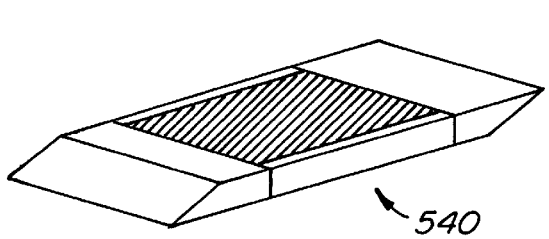
FIG. 5G.
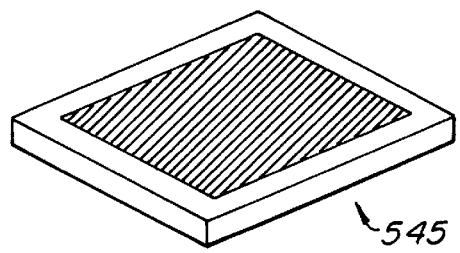
FIG. 5H.

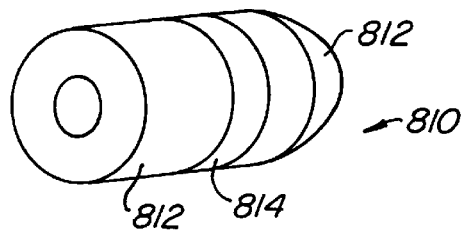
FIG. 8A.
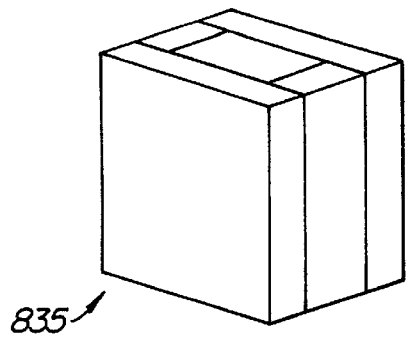
FIG. 8F.
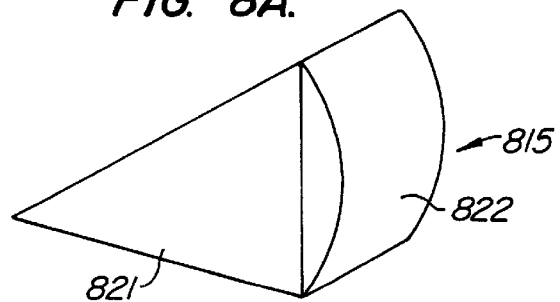
FIG. 8B.
FIG. 8C.
FIG. 8G.
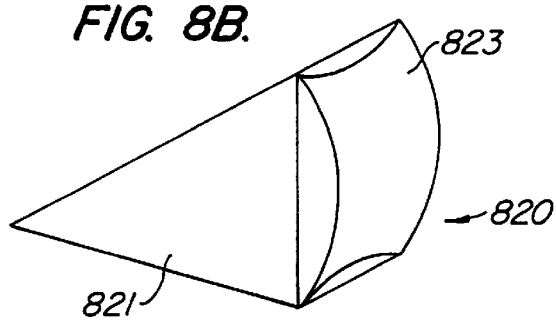
FIG. 8H.
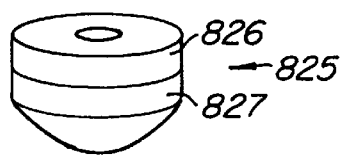
FIG. 8D.
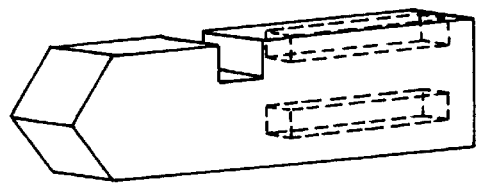
FIG. 8I.
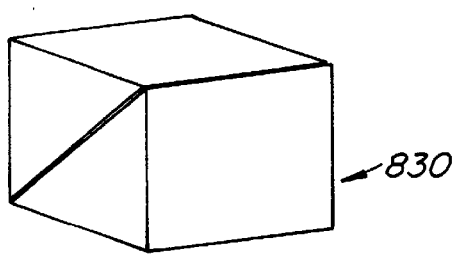
FIG. 8E.
FIG. 8J.

COMPOSITE OPTICAL AND ELECTRO-OPTICAL DEVICES

This is a Continuation-in-Part of application Ser. No. 08/330,174, filed Oct. 27, 1994, now abandoned, which is a Divisional of application Ser. No. 07/919,374, filed Jul. 29, 1992, now U.S. Pat. No. 5,441,803, which is a Continuation of application Ser. No. 07/672,251, filed Mar. 20, 1991, now abandoned, which is a Continuation-in-Part of application Ser. No. 07/597,987, filed Oct. 15, 1990, now abandoned, which is a Continuation of application Ser. No. 07/446,214, filed Dec. 5, 1989, now abandoned, which is a Divisional of application Ser. No. 07/238,563, filed Aug. 30, 1988, now abandoned.

BACKGROUND OF THE INVENTION

The present invention relates generally to composite devices, and more particularly to a method of producing composite devices with essentially defect free bonds.

Although it has been a goal of modern optical, electro-optical, fiber optic and semiconductor technologies to form perfect bonds between various materials, this goal has generally only been achieved for a small range of materials. Furthermore, typically the selected bonding technique has been subject to a variety of performance and/or fabrication limiting restrictions. However, given the importance of joining materials for a variety of technologies, the prior art is replete with numerous different bonding techniques. While some bonds of the prior art may be adequate for establishing improved heat transfer or for improving other properties such as strength or optical transmission across the bond interface, these bonds generally neglect the interrelationship between the optical quality and homogeneity of the bond.

Organic Adhesives

Organic adhesives such as epoxies and polyimides are the most common means of securing bonds between similar or dissimilar materials. While these adhesives have been applied to a variety of devices, including solid state laser systems, they suffer from numerous disadvantages. First, they tend to gradually decompose when they are subjected to intense laser radiation. Therefore their usefulness may be limited to applications requiring a single or at most a few bursts of laser radiation, for example such applications as laser-initiated explosive ordnance. They are not practical when long-term reliability is an important requirement for economic viability of a laser device. Second, there usually exists a difference in refractive index between the organic adhesive and the components to be bonded. It is normally impossible to overcome this difference since the indices of organic adhesives are rarely available beyond an index of 1.6 while many of the crystals to be bonded have significantly higher indices. Third, organic adhesives generally have poor thermal and mechanical properties thus making them poor candidates for components requiring high reliability. Fourth, organic adhesives are usually prone to outgassing, especially when evacuated or when heated, thus leading to performance deterioration due to contamination.

Inorganic Frits and Glasses

Another technology for bonding and/or sealing similar or dissimilar materials employs inorganic low-melting temperature glasses either as powders suspended in inorganic or organic vehicles or as readily applicable preform sheets. Different thermal expansions and refractive indices are available for obtaining a certain degree of matching between the properties of the frit and those of the components to be bonded, thus providing at least limited utility. Examples of this type of bond include hermetic sealing of semiconductor devices and graded expansion seals between metal-glass joints.

Brazed or Metal-Sealed Joints

A third type of bonding technique utilizes metals deposited from the vapor phase or mixtures of metals with glass frits. The bonding material is applied to the components to be joined, such as high temperature ceramics, which can then be soldered together. This technique is clearly only useful for those applications where the presence of metal at the interface is not objectionable, thus generally ruling out components which require optical transmission across the interface. Electrical insulation and dielectric properties also are compromised by the presence of metal within the bond. Hermetic seals are achievable using this technique.

Diffusion Bonding

Ceramic components are frequently bonded with an intermediate layer of lower temperature metal which will diffuse into the adjacent components and generate a bond. While this bond has utility for ceramic bonding, it is of little use for electro-optical precision components.

Vapor Deposition

The evident disadvantages of adhesive layers has resulted in intensified efforts to find a technique which either eliminates or at least minimizes the bonding agent. Vapor deposition represents one technique of depositing one or more layers, each layer being approximately a micron thick. These layers can be formed from metals, carbon-containing compounds, and inorganic compounds such as oxides, fluorides or chalcogenides. Thicker layers can be deposited by sputtering.

Glass Lamination

A technique which can be used with glasses for a few specific applications is that of glass lamination. In this technique molten sheets of glass are laminated at high temperatures by an elaborate process in which molten glass exits slit-shaped orifices and is subsequently pressed together. The joining process occurs at temperatures well above the glass transition temperature. This process is not only impossible to apply to a variety of glasses, it is simply impractical for many specialized applications primarily due to the high working temperatures.

Fusion Splicing

The technique of fusion splicing of optical fibers has enjoyed relative success, especially in the arena of optical communication. Currently optical fibers can be fused together resulting in a relatively low optical loss bond. Unfortunately this technique has not proven to be as successful with optical fibers used to transmit high power laser radiation. For this application even minor defects such as those commonly associated with fusion splicing will result in unacceptable levels of absorption and scatter, potentially leading to catastrophic failure of the bond. A further problem associated with fusion splicing is that this technique is restricted to joining fibers of the same or similar chemical composition, such as silica-based fibers with other silica-based fiber ends. Inputs and outputs of optical fibers from electro-optical devices have to be joined by methods which are fraught with disadvantages, typically resulting in unacceptable loss levels at the device interface.

Anodic Bonding

Anodic bonding is a technique utilizing electrostatic fields to irreversibly join planar surfaces of electrically conducting materials with electrically insulating materials. Anodic bonding is extensively employed for bonding semiconductor wafers, specifically silicon wafers, with borosilicate glass. The primary applications are to seal the silicon structure underneath and to provide an insulating interlayer between two silicon wafers bonded together. Strong, hermetic seals can be obtained at relatively low temperatures, between 300 and 6500 C., thereby preventing damage to previously applied metallizations and structures. Electrode design, thermal chuck design, and thermal expansion coefficients are critical parameters for the success of anodic bonding.

Fusion Bonding

Polished silicon wafers contain a thin hydroxyl layer, effectively resulting in a hydrophilic surface. Adhesion by hydrogen bonding begins when two wafers come in contact with each other. Mechanical bond stability increases with further heat treatment. The hydroxyl groups initially rearrange to form bonds of higher stability, decreasing the separation between the adjoining surfaces. Gradually the bonds undergo condensation reactions, resulting in silicon-oxygen-silicon bonds between the wafers. The released water is removed by diffusion from the bond interface through the silicon network and the gap between the components. Exposure to higher temperatures result in even stronger silicon-silicon bonds.

This technique of wafer bonding is essentially restricted to areas of the order microns. This may be sufficient for certain research applications but is not practical for a production of electro-optical devices. Thus when this technique is applied to large wafer areas, typically the overall contact area between the wafers is a composite of bonded areas and unbonded areas. The transition between the bonded and unbonded areas represents an area of partial bonding of somewhat reduced adhesion, the adhesion characteristics being a function of specific location. This results in the composites mechanical, electro-optical, optical and thermal properties being dependent on location.

Diffusion bonding

In the prior art method of diffusion bonding, adjacent surfaces are brought into close contact under pressure and heated in an appropriate atmosphere to allow diffusion across the interface. While it may initially appear that the application of pressure would alleviate problems with defects at the interface, it is likely to have the unintended adverse effect of prematurely trapping gas in the interface area by sealing it in before it can escape. When this technique is used with single crystal wafers and at temperatures which are insufficient to allow plastic deformation, the applied pressure can generate micro-cracks. If the processing temperature is raised sufficiently to prevent micro-cracks, the plastic deformation of the wafers will disturb the crystal structure.

Wringing

U.S. Pat. No. 4,810,318 discloses a technique of bonding in which two components such as glass, quartz or silicon are joined with at least one layer of polycrystalline material. Typically the layer is an electro-optically active layer such as $TiO_2$, $MgF_2$, $Al_2O_3$, $Ga_2O_3$, $HfO_2$, ZnS, $BaTiO_3$, or $Y_3Fe_5O_{12}$ which has been deposited by vapor deposition or sputtering. The disclosed method requires that the components undergo a slight polishing treatment, preferably with cerium powder, for less than a minute to activate the surfaces to be bonded to create a "fresh" surface. The prepared component surfaces are brought into contact by wringing. No heat treatment is applied.

Wringing as a means of providing intimate contact between two components is extensively employed in the course of precision machining or measurements to temporarily join gauge blocks of tool steel, WC or $ZrO_2$ ceramics with flat surfaces, usually with the aid of a thin layer of mineral oil to improve sliding of the two blocks on each other. This is discussed on page 136 of *Foundations of Mechanical Accuracy*, The Moore Special Tool Company (1970). obviously wrung-in-contact gauge blocks do not need to provide an optical quality interface free of scattering imperfections. Since the techniques disclosed in U.S. Pat. No. 4,810,318 would not be sufficient to eliminate such defects as gas or particulates, the resultant interface would not be a low scatter interface. Therefore this technique is limited to joining components which are not sensitive to scatter at the interface.

Mechanical Contacting

EPA Patent No. 0 209 173 discloses a process of contacting optically smooth surfaces of semiconductors or of optically or magnetically active materials with each other in a dust-free atmosphere in order to obtain a mechanical connection, after which they are subjected to a heat treatment of at least 300° C. The invention discloses subjecting the components to be contacted to a bond-activating treatment which removes surface microscopic irregularities. The disclosed treatment consists of a light surface smoothing and/or chemical etching. The patent also cites the deposition of a layer of wet spin coating followed by the removal of the organic constituents by heat treatment to at least 800° C. as another bond-activating treatment.

The method of contacting activated surfaces disclosed in EPA Patent No. 0 209 173 does not provide the necessary control required for reproducible fabrication of semiconductor or electro-optical devices. This method emphasizes the establishment of a mechanical bond without considering interface defects or how to overcome them. Large areas of non-bonded surfaces are generally part of such a bonding treatment since bonding occurs at first contact of the surfaces. The alternative use of spin coating as a bond-activating treatment not only results in gas entrapment but also tends to modify the physical properties of the components at the bond interface. Additionally, heat treatment of the spin coated surfaces results in glass formation with microscopic mud cracks which reduce surface smoothness and result in reduced contact between adjacent surfaces.

Optical Contacting

Optical contacting has long been known and employed in the fabrication of optical components such as cuvettes of fused quartz for spectroscopy. This technique is capable of providing a bond of high optical quality without defects at the interface and therefore, without scattering losses. The bond exhibits nominal strength at room temperature. The bond is believed to be established predominantly by hydrogen bonding across the interface. While the bond can withstand short exposures to aqueous or non-aqueous solvents, it usually debonds by diffusion of aqueous or non-aqueous solvent or detergent into the interface from the edge which constitutes the bond line between the components in optical contact. This results in instability of the bonded components which can lead to complete bond failure unless the bond line has been sealed. Even if the bond is sealed, it is inadequate for devices where reliable, permanent bonds between components of well-defined interface properties are required.

Optical Contacting and Subsequent Heat Treatment

U.S. Pat. No. 5,441,803 and copending application Ser. Nos. 08/330,174 and 08/339,147, each incorporated herein by reference for all purposes, disclose the use of optical contacting in conjunction with a subsequent heat treatment.

From the foregoing, it is apparent that a method of forming defect-free permanent bonds is desired.

SUMMARY OF THE INVENTION

The present invention provides a method of forming defect-free permanent bonds without the use of adhesives as well as devices formed by this method. In general, the disclosed process allows similar or dissimilar crystalline, vitreous or dense polycrystalline ceramic, metallic or organic polymeric components to be first joined by optical contacting and then heat treated to stabilize the bond. The heat treatment can be performed at a low enough temperature to prevent interdiffusion between species, thus insuring that the bond is not subjected to excessive mechanical stresses and that the materials do not undergo phase changes. Therefore the present invention allows stable bonds to be formed between materials of widely differing physical, mechanical, thermal, optical and electro-optical properties such as different hardness, chemical durability, mechanical strength, coefficients of thermal expansion, thermal conductivity, crystal structure, refractive indices, optical birefringence, nonlinear optical coefficients, electrical conductivity, or semiconducting properties.

In one embodiment of the invention crystalline waveguide structures of various core and cladding combinations, configurations, lengths, and performance are disclosed. The core may consist of a material of a selected refractive index or may be hollow. Heat treatment temperatures and cladding/core materials and configurations can be selected to exert a controlled directional stress on the core.

In another embodiment of the invention one or more crystals of high thermal conductivity are bonded to an electro-optically functional device structure, thereby providing a means of controlled heat removal. For example, heat sinks can be made of silicon, gallium arsenide, indium phosphide, diamond, or sapphire.

In another embodiment of the invention composite structures are formed which contain functional optical coatings or thin films at the interface between components. For example, using the disclosed technique a solid state laser composite structure can be fabricated containing multilayer optical coatings at interfaces between adjacent laser-active, nonlinear optical, passive Q-switching, or nonlaser active host lattice or other single crystalline or vitreous components. It is also possible to use the disclosed technique to bond a non-linear optical crystal for harmonic frequency generation with a solid state laser material, either directly or with an optically active thin film at the interface.

In another embodiment of the invention composite optical elements are formed which are stable over time and resistant to indiffusion of moisture, vapors, and fluids. These composite elements can be used with high energy lasers without suffering from laser damage. These composite elements can include polarizing components, lenses, and recessed optical surfaces. They are built without the use of any inorganic or organic adhesive, cement or glue. Besides using conventional optical glasses as materials of construction, these anamorphic optical elements can be constructed of sapphire for application at high temperatures or of other crystalline or vitreous material, and can consist of optical surfaces which are impossible to generate as part of one single optical component by the prior art without resorting to some type of cementing process. A specific embodiment of the present invention is a linear array of cylindrical microlenses for use in focusing pump light from a laser diode array onto a solid state laser device. The microlenses can consist of fused quartz or any other optically functional vitreous or crystalline material. Another specific embodiment of the present invention are optical sensors which contain recessed optical surfaces to provide for feedback from probe beams emanating from and returning to optical fibers.

A further understanding of the nature and advantages of the present invention may be realized by reference to the remaining portions of the specification and the drawings.

BRIEF DESCRIPTION OF THE DRAWINGS

FIGS. 5A–H illustrate a variety of composite solid state laser configurations according to the present invention;

FIGS. 8A–J illustrate a variety of composite optical elements according to the present invention.

DESCRIPTION OF SPECIFIC EMBODIMENTS

General

Figure 1A:
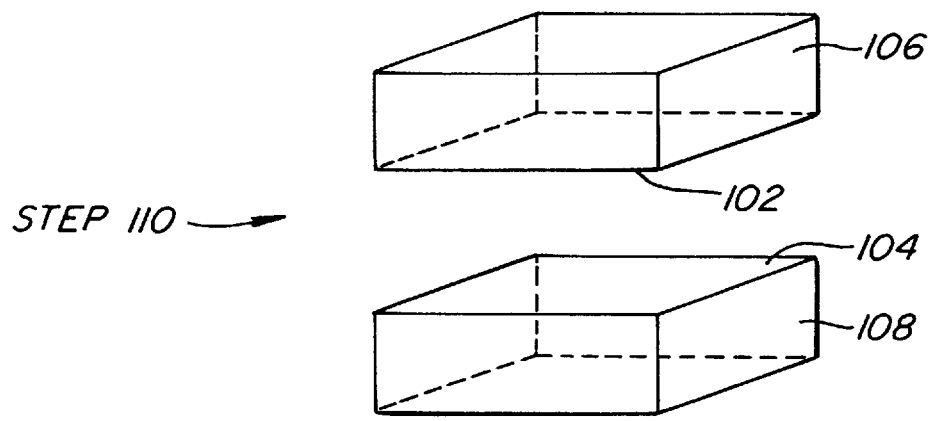
FIGS. 1A–C schematically illustrate the bonding process according to the present invention.

In general, the invention described herein uses optical contacting in conjunction with heat treatment to provide a virtually defect-free bond interface of high strength. This method is generally applicable to bonding both similar and dissimilar glasses and crystals.

Optical contacting is defined as bringing precision polished surfaces into contact in such a manner that interference fringes form between them which gradually vanish completely as air or fluid is pushed out of the interface. However, complete disappearance of the interference fringes is only possible when the surface figures of the two surfaces to be optically contacted allow all of the gas or fluid between the two surfaces to escape from the interface as it forms. The complete disappearance of interference fringes provides assurance that there is no particulate matter trapped at the interface. Another condition for defect-free optical contact is a precision polish of optical smoothness, free of any visible scratches or digs on the surface.

It is extremely unlikely that two mirror polished surfaces will form a complete optical contact when they are brought into contact with one another. Typically, the formation of a complete optical contact requires additional precautions. For example, a perfect flat and smooth surface of better than 1/10 wavelength flatness brought into contact with a polished concave surface will establish optical contact first at the edges, thus effectively trapping gas at the interface. The trapped gas prevents the disappearance of the fringes and will cause reflective losses due to the large difference in refractive indices of the air and the adjacent crystalline or vitreous components. Obviously the aspect ratio of components to be optically contacted is important in determining if a given surface figure is adequate.

The resultant interface formed from properly optically contacted components is free of scattering inclusions and defects and may be termed optically homogeneous. However, the refractive index of the two components bonded by this technique will only be identical if the refractive index of the starting components is identical. Combining crystals or glasses in the same orientation with respect to each other or of identical refractive index can result in interfaces which become indiscernible from the bulk by visual inspection. Although the interfaces will not represent a perfect match in crystal lattice when examined by X-ray analysis, they are thought to be analogous to a crystal twin of controlled and large dimensions.

As briefly described above, the combined components are subjected to a subsequent heat treatment in order to strengthen the interface bond. As the temperature increases during heat treatment, the bond strength gradually increases as hydrogen bonds are believed to initially form a tighter network and surfaces are drawn closer together by molecular attractive forces. Diffusion is believed to be the mechanism by which these rearrangements of hydrogen bonds occur. Hydroxyl groups will condensate and form metal-oxygen-metal bonds. Water of condensation will diffuse out along the interface and also will diffuse into the crystal or glass lattice structure. Lattice rearrangements by diffusion of oxygen, fluoride, vacancies or other component species at the interface results in a bond which has been determined to be as strong as that of non-bonded control samples of the same crystals, glasses or dense ceramics.

Although higher temperatures result in stronger bonds, there are many instances when such a perfect bond is not required. For these applications the optically transparent interface formed during the lower heat treatment conditions has an adequate bond strength given the intended use.

In some situations side reactions have been observed to occur when crystals or glasses are heat treated to high enough temperatures to cause extensive diffusion of component species. While the stability of some glasses such as pure fused quartz is excellent and resistant to devitrification, this is not necessarily the case when the glass contains finely dispersed, in-situ grown, crystalline species which have been obtained by precipitation during a careful heat treatment schedule. Examples of these types of glasses are photosensitive glasses and filter glasses with dispersed silver halide, chalkogenide crystalline, or amorphous species. Depending on the formation conditions used to generate these species as well as their overall stability, their properties can be altered by exposure to too high of a temperature during heat treatment. Another example of heat treatment sensitive materials is the whole family of low expansion glass ceramics where the expansion characteristics have been obtained by careful heat treatment of an originally completely vitreous body. While low coefficients of expansion are likely to remain low, their specific dependence on temperature around room temperature may be altered in a way which is not desirable and which may make them inappropriate for applications demanding extreme stability such as laser gyroscope bodies, sensor components, or astronomical mirror substrates.

There are many crystals which change crystal structure by lattice rearrangement at specific temperatures. For example, alpha-quartz transforms into a different crystal structure at approximately 578° C. The thermal expansion coefficients of the two crystalline structures are sufficiently different from each other that this transition can cause irreversible structural changes of a valuable alpha quartz crystal. Alpha-quartz is therefore grown hydrothermally at temperatures below that transition temperature. Therefore heat treatment during bonding of components of alpha-quartz beyond that transition temperature can result in irreversible destructive change.

A variety of other hydrothermally grown crystals form defects when subjected to heat treatments above a certain critical temperature. For example, potassium titanyl phosphate (KTP) can develop striation-like defects when the crystals are heat treated above approximately 500° C. Laser crystals such as Yb:S-FAP have been observed to develop cloudy regions in the bulk of the crystal on reheating to 800° C., while they remain transparent and stable when reheated to 500° C.

Dopants are commonly added to crystals in order to make the host laser-active or to provide some other desired characteristic. Depending on how well the size of the dopant ions fit into the host lattice as well as their concentration, they can become unstable at higher temperatures resulting in agglomeration as nuclei of a different crystal. Typically this instability occurs when the temperatures are sufficiently elevated that interdiffusion of vacancies and other component species starts between adjacent surfaces. In any case, this agglomeration of dopant ions is undesirable because it may result in unfavorable changes in such electro-optical properties as the material's lasing characteristics. For instance, it is well known that $Nd^{3+}$ in yttrium aluminum garnet (YAG) does not represent a very good fit of ionic radius in the substitution of $Y^{3+}$ ions. Therefore, heat treatment of Nd-doped YAG can cause some type of phase separation into a Nd-rich phase suspended in the YAG host lattice.

Another possible consequence of prolonged and elevated heat treatment is the gradual appearance of a multitude of random lines which can eventually result in the interface becoming opaque. This phenomena is thought to be caused by the formation of a new crystalline phase of different refractive index. Although this phenomenon is not well understood, it is ascribed to subsurface damage which was not or could not be removed during the preceding finishing operations. The tendency of this phenomena to occur appears to be related to the crystal structure and possibly related to the chemical durability of the crystal against the polishing medium. It has been found to be severe for some fluoride crystals such as lithium yttrium tetra-fluoride (YLF) and phosphate-based laser glasses.

Another limitation may occur when components of different coefficients of thermal expansion are heat treated during the bonding process at temperatures at which interdiffusion of species between the adjacent surfaces takes place. This potentially results in a component which is stable only at these elevated temperatures. When the composite structure is cooled, the difference in thermal expansion between the components results in thermal stresses which in turn give rise to bond failure by random fracture or separation along the interface. This failure due to thermal stress is not restricted to components of different crystal structure or chemical composition but also occurs in crystals which have different coefficients of thermal expansion in different crystallographic orientations. Joining of optical plastic components with glasses or crystals may also result in stresses which may render the device properties inferior or may ultimately lead to catastrophic failure.

It is generally desirable to preserve the optical or electro-optical properties in the bonded device. For example, InP, GaAs and other semiconducting crystals exhibit nonlinear optical properties in the infrared spectral region. These properties can be useful for constructing quasi-phase matched stacks by bonding crystal lamellae which are oriented along the crystallographic [111] direction such that In rich and P rich surfaces are adjacent to each other. If the bonding temperatures of these crystal stacks are high enough for diffusion to occur between the In and P rich surfaces, an interface structure of new composition is created which has properties which are not identical to those of the bulk crystal lamellae and, therefore, results in a device performance which deviates from the designed QPM stacks.

Process Parameters

Figure 1B:
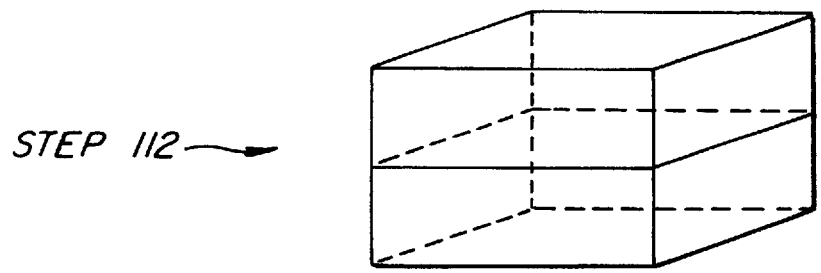
Figure 1C:
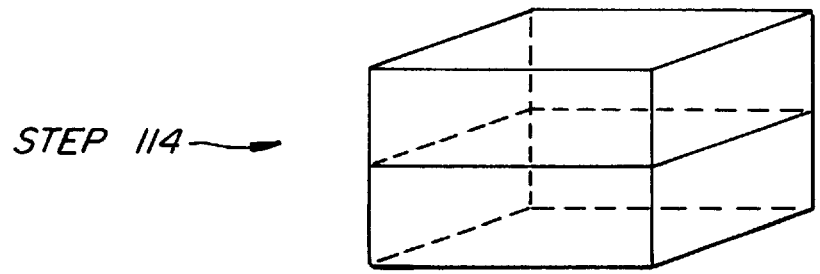
Figure 2A:
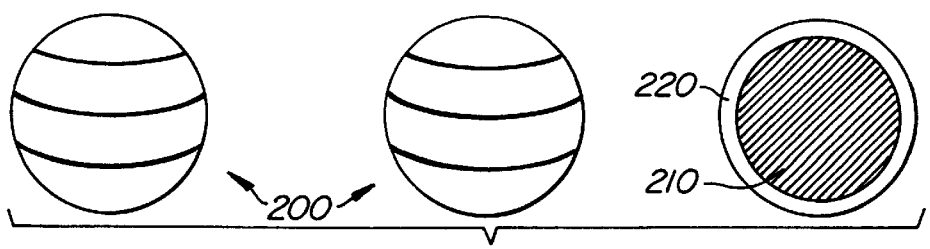
FIGS. 2A–F illustrate a number of suitable and unsuitable surface fringe patterns for optical contacting components of different aspect ratios.
Figure 2B:
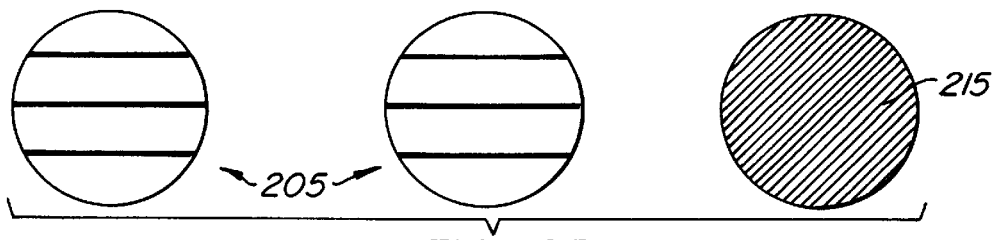
Figure 2C:
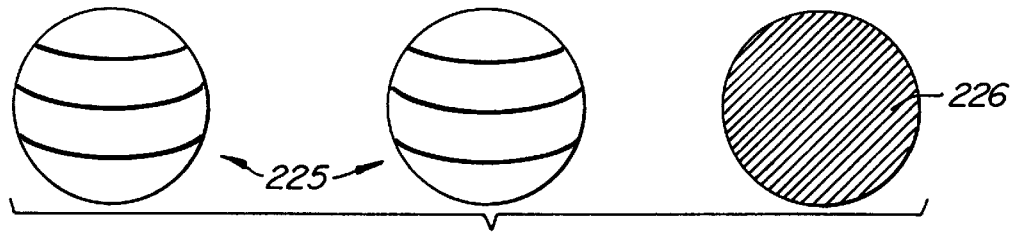
Figure 2D:
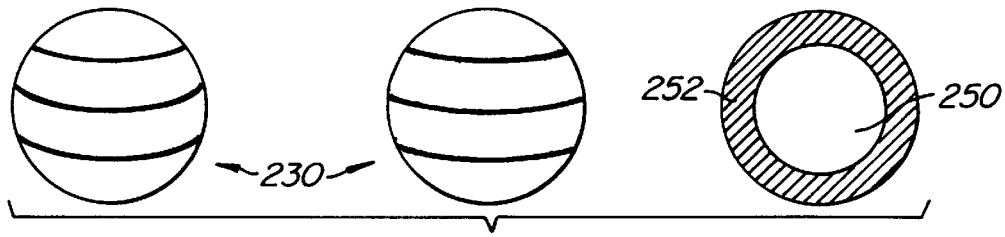
Figure 2E:
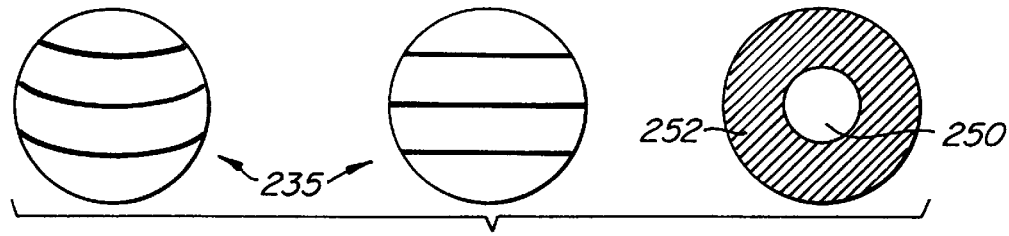
Figure 2F:
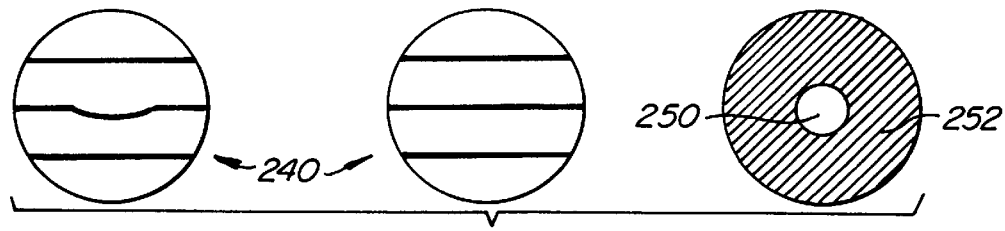
Figure 3A:
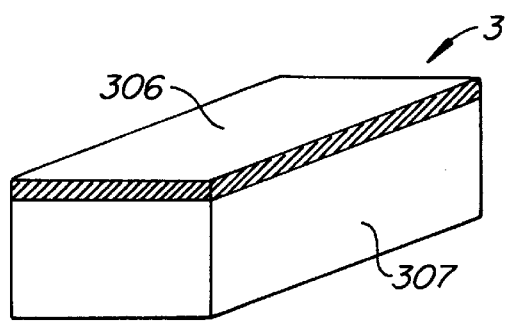
FIGS. 3A–H illustrate several waveguide structures according to the present invention.
Figure 3B:
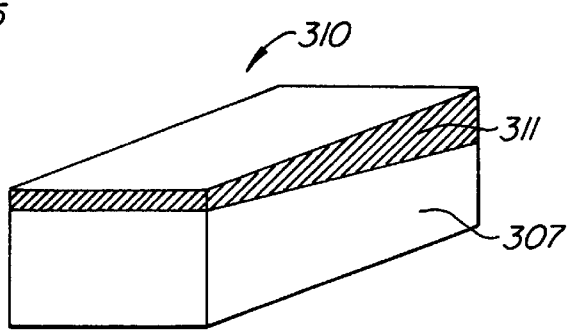
Figure 3C:
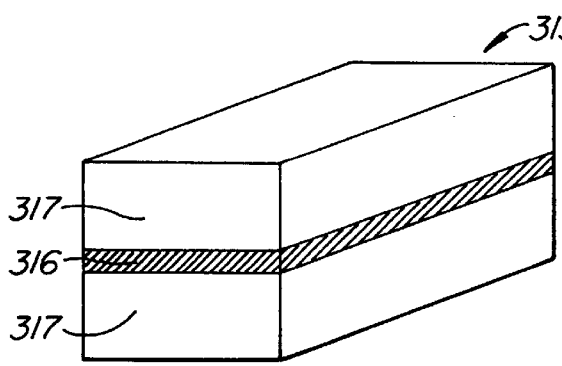
Figure 3D:
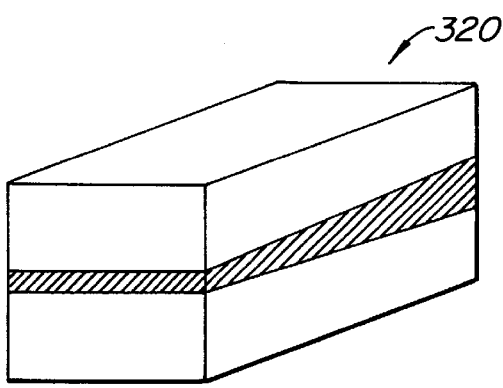
Figure 3E:
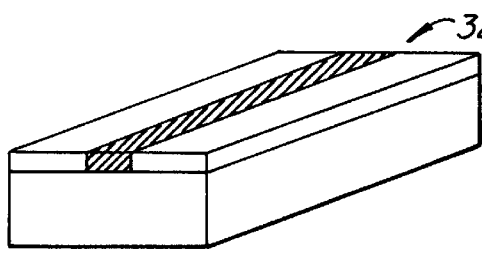
Figure 3F:
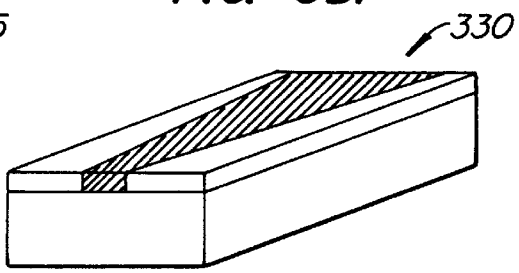
Figure 3G:
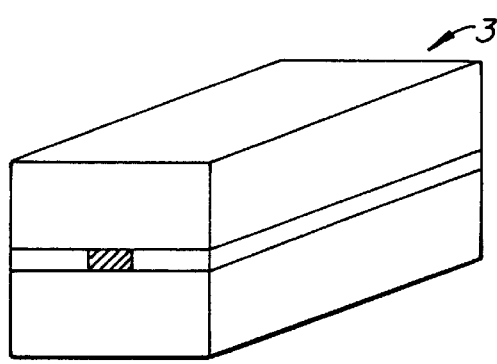
Figure 3H:
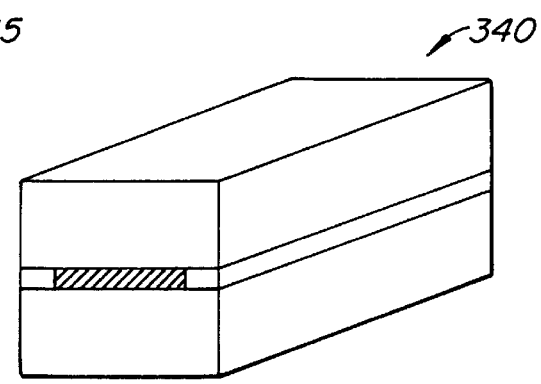
Figure 4A:
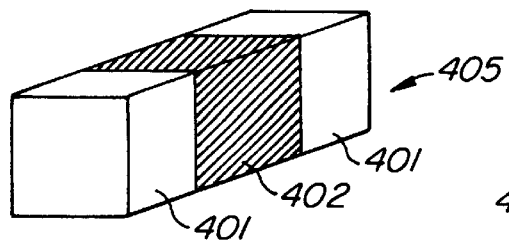
FIGS. 4A–H illustrate the cores of several complex waveguide structures fabricated according to the present invention.
Figure 4B:
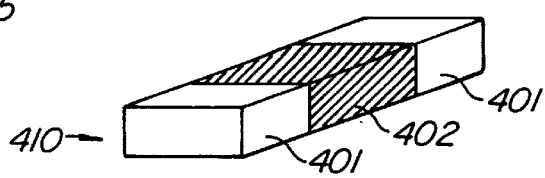
Figure 4C:
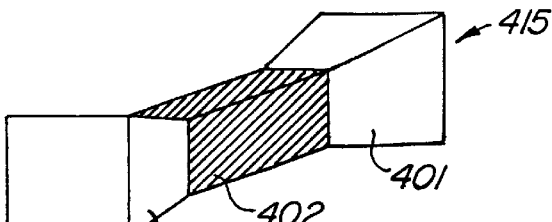
Figure 4D:
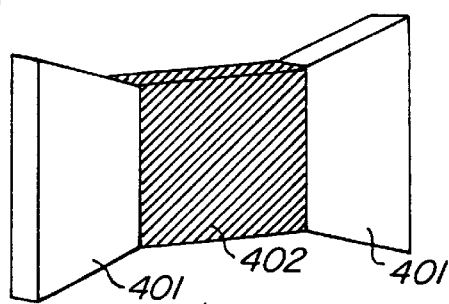
Figure 4E:
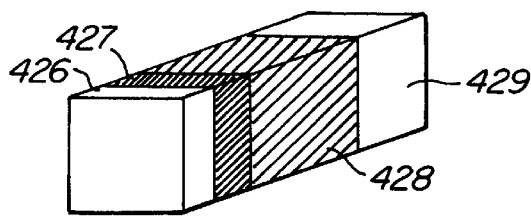
Figure 4F:
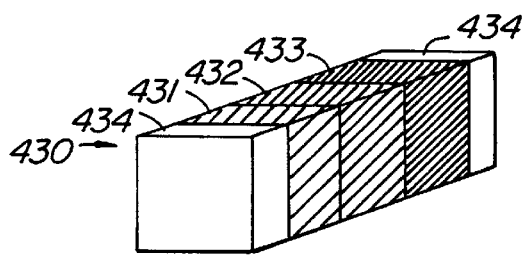
Figure 4G:
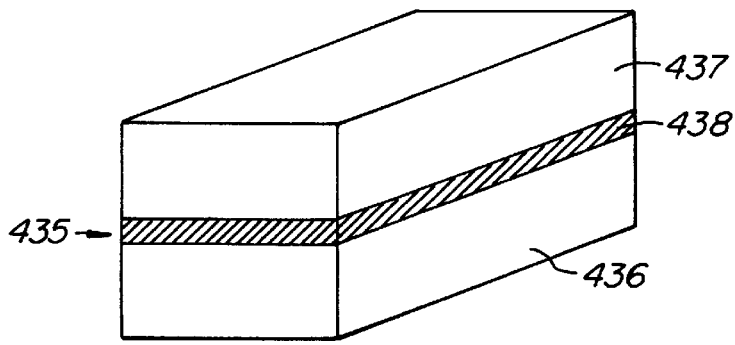
Figure 4H:
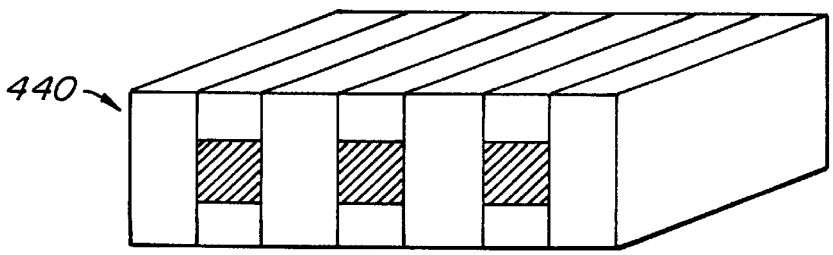

The basic process steps used to produce composites according to the present invention are schematically shown in FIGS. 1A–C. In FIG. 1A surfaces 102 and 104 of components 106 and 108, respectively, are to be bonded. The first step (step 110) is to precision polish and clean surfaces 102 and 104. After preparation, the components are optically contacted (step 112) and heat treated (step 114). After the bonding process has been completed, the composite can undergo further processing such as cutting, milling, grinding, and polishing if necessary. Since one object of the present invention is to produce close-to-perfect bond interfaces of negligible optical scatter or absorption losses, these fabrication steps assume great importance because they ultimately will determine the quality of the interface.

Surface figure and surface finish are the two principal parameters which determine the quality of a precision polished surface. The surface figure is conventionally expressed as the deviation from the intended surface figure of the whole surface, the deviation being given in terms of fractions of light at the wavelength of the inspection source. Deviations are observed as interference fringes with an interferometer or with test plates. Short-range deviations of the intended surface figure are called waviness and can be expressed as deviations in units of wavelengths as a function of distance on the surface under consideration. Surface finish is understood to represent the microroughness of the surface. Microroughness is generally the result of defects such as scratches and digs which are either left over from the grinding and polishing steps or have subsequently been introduced during processing or handling.

Molecular attraction between two surfaces in close contact will exert forces on the two contacting surfaces, thus tending to deform the two surfaces so that the maximum possible optical contact is reached. The scientific foundation of molecular attraction and optical contacting has not been sufficiently elucidated. A phenomenological description of the force, stress distribution and potential energy between two ideally smooth isotropic solid elastic bodies in optical contact with each other links macroscopic observable properties with the more fundamental materials properties. When the two bodies in contact are in the proximity of a few angstroms from each other, their area of contact becomes a circle. The radius of that circle depends on the force causing the contact, i.e. the molecular force, as well as the modulus of elasticity and Poisson ratios of the two bodies. (L. D. Landau and E. F. Lifshitz, *Solid Bodies in Contact*, Theory of Elasticity, 3rd Edition, pp. 26 (1986)). This theory can be extended to ideal ellipsoidal bodies with an ellipse as the area of contact, and to nonisotropic crystalline bodies which have nonisotropic mechanical properties. Perfectly clean surfaces of undisturbed surface morphology and chemistry would be expected to bond into a permanent bond at room temperature. Analogous real surfaces of very large radii of curvature will optically contact, resulting in a reversible bond. In principle, the theory allows predictions of how optical contact can be achieved between two real surfaces. Even quantitative predictions appear in principle possible but would require extensive modeling and computations, e.g. the microroughness can be approximated by periodically arranged spherical or sinusoidal segments, and actual shapes can be evaluated by finite-element-analysis. This type of analysis may allow specifications for optimal surface figures of actual bodies to be prepared which would result in defect-free optical contact.

The actual amount of deformation and the quality of the interface of the surfaces of the two bodies as a result of optical contact depends on a wide variety of conditions. They can qualitatively be deduced from the following theoretical treatment:

Surface finish: The average surface smoothness is preferred to be as high as possible. The surface finish has to be of the order of about 10 Å rms but it is readily understandable that the better the surface finish, the better the bond and interface quality. Surfaces which have been precision polished for laser applications are usually suitable. Any isolated high points in the surface profile will not allow complete bonding in the surrounding areas. Any surface defects, termed scratches and digs, which remain due to incomplete polishing, should be avoided, and be preferably below the specifications 10/5 for scratches and digs. Edge chips, scratches, and digs introduced during handling or processing after polishing are even more serious defects because they often have raised edges. If optical contact is possible in surrounding areas, it is clear from the above discussion that the deformation of the bodies under the influence of the molecular forces will result in areas of stress.

Surface figure: A specific surface figure has to be attained. Since optical contact is established as interference fringes disappear at the interface, the fringe patterns of the two surfaces are an important parameter.

Cleanliness: The ability to clean a surface before optical contacting is very important. Surfaces of materials of high chemical durability such as silicon wafers, laser crystals of the garnet structure or sapphire, can be cleaned much more readily by standard known methods than materials of low durability or even water soluble materials. Contamination with organic compounds can render the surfaces unsuitable. Organic solvents usually are acceptable as cleaning agents if the proper heat treatment schedule is followed to remove them. Particulate contamination has to be avoided, especially inorganic particles which are nonvolatile during heat treatment. Micron- or submicron-sized lint particles may be tolerated as long as they still allow the fringes to disappear at the interface at room temperature, again if a proper heat treatment schedule can be applied to volatilize them by oxidation.

Chemical nature of materials: The ability to clean a surface is affected by the chemical durability of the surfaces. A less obvious problem may occur when latent scratches become visible at the interface during heat treatment. Although this phenomenon is not well understood, it is encountered for materials of low chemical durability such as phosphate glasses or fluoride crystals. Heat treatment to temperatures which allow extensive diffusion at the interface can result in the appearance of scratch patterns which are thought to have originated during the preceding grinding and polishing processes. However, even durable materials such as yttrium aluminum garnet can develop latent scratches during prolonged heat treatment at high temperatures. The ability to form hydroxyl groups on the cleaned surfaces, resulting in a continuous film of water or hydrophilic organic solvent, can also have an effect on the ease and the strength of the initial bond between the two materials.

Mechanical properties: As discussed above, the components to be bonded may have the ability to deform elastically under the influence of molecular attractive forces acting between the two surfaces. Therefore the modulus of elasticity, crystal structure, and physical dimensions influence the ability to form an optical contact. The aspect ratio of the bodies is very important. Surfaces of wafers can deform much more readily than surfaces on the end of rod-shaped bodies. Attractive forces can be strong enough to cause fracture during deformation, depending on aspect ratio, initial surface figures, finish, crystal structure, fracture strength, and the existence of surface flaws. However, even if fracture does not occur, excessive deformation during optical contact is not desirable since the resultant stresses can often only be annealed out at temperatures which are higher than desirable. Furthermore, excessive deformation can lead to a nonuniform bond strength since the strength of the bond is dependent upon the degree of deformation.

Surface area: Larger surfaces, even at constant aspect ratios, present a more difficult problem in establishing defect-free interfaces due to the increased probability of particulate contamination. Bodies with small surfaces, such as optical fibers, normally require specialized fixturing in order to maintain the components in stable contact long enough to allow the fringes to disappear and establish an initial bond by optical contact.

FIGS. 2A–F illustrate the interference fringe patterns for a series of surface pairs as well as the resultant optical contact areas for each of these pairs. The surfaces are from cylindrically shaped components and therefore, due to the aspect ratio, will exhibit a limited ability to deform. The preferred fringe patterns are illustrated by surface pairs 200 and 205 since the resultant contact areas, 210 and 215, respectively, essentially extend over the whole interface. Surrounding contact area 210 is a rim 220 which is not optically contacted. However this rim can be removed by a process such as grinding after the composite has been heat treated. Contact area 215 shows an interface of complete optical contact when flat surfaces without chamfered edges and without any edge chips are brought into optical contact. Surface pair 225 has matching convex and concave surfaces, thus achieving complete optical contact 226. Pair 225 demonstrates that nonplanar surfaces can bond according to the present invention. Therefore spherical, cylindrical and even aspheric matching surfaces can be optically contacted as long as the same precautions are observed as for planar surfaces. Surface pairs 230, 235, and 240 depict a few pairs in which complete optical contact is not possible, thus resulting in enclosed areas 250 which are not bonded surrounded by optically contacted areas 252.

After all of the requirements relating to surface figure, finish, and cleaning have been fulfilled, then optical contacting can be performed. The optical contacting step can take place under a variety of conditions, for example with dry, moist, or wet surfaces at ambient or elevated temperatures and at atmosphere or in a vacuum. A temporary change in surface figure can be brought about by careful mechanical or thermal deformation of the surfaces to be optically contacted in order to control the initial point of contact from which the bonding will spread over the whole interface. A regular pattern of interference fringes characteristic of the surface figure of the two surfaces brought into contact appears at first and gradually fades, resulting in optical contact. The time it takes for the optical fringes to disappear depends on the parameters discussed above, as well as the presence or absence of cleaning fluid at the interface. Cleaning fluid, usually deionized water, is displaced by the gradually increasing molecular forces which attract the two surfaces to each other. If there are imperfections, inclusions, and fringe colors left at the interface, this is evidence that the process leading to optically contacted bodies has not been followed correctly.

While it is considered likely that the bond strength and durability of the optically contacted interface will increase even at room temperature to values which make practical applications possible, the time required for this to happen is usually impractically long, ranging between weeks to years. The length of time required to form this bond depends on the chemical nature of the materials as well as the other parameters cited above.

Optical contact results in a bond which is strong enough to enable placing the joined components in any convenient position for heat treatment without considering the effects of gravity. By way of example, an assembled composite rod can be placed horizontally into a furnace without risk of debonding during heat treatment under the influence of gravity. Therefore, there is no need to apply an external force to the composite during heat treatment. Application of external pressure can, however, be included in the process of the invention although this will complicate fixturing during heat treatment.

The atmosphere during heat treatment depends on the chemical properties of the materials. If traces of organic contaminants are present at the interface between inorganic components, then a heat treatment step in an oxidizing atmosphere will remove these contaminants. This step, however, can be left out or can be followed by subjecting the materials to an inert, reducing, or a vacuum atmosphere depending upon either the requirements of the specific materials or of the devices to be produced.

The maximum temperature of heat treatment according to the present invention depends on the materials to be bonded. It can be as low as about 80°–100° C. for heat sensitive materials such as organic crystals, plastics, or materials which undergo phase transitions at higher temperature. The maximum permitted temperature is higher when combining inorganic crystals or glasses, thus resulting in an increase in both bond strength and thermal shock resistance. However, lower treatment temperatures will suffice when high bond strength is not a requirement for the final working device. In general, the heat treatment temperature may be higher for bonding crystallographically and chemically same or similar materials than for dissimilar materials. Ionic and vacancy diffusion may occur at these higher temperatures, resulting in very strong bonds. Side reactions such as phase separation and appearance of latent scratches at the interface often require that this temperature be kept below temperatures at which significant interdiffusion between the adjacent surfaces will occur. It is believed that some side reactions may be initiated by absorbed impurities which are left at the surface. Other reactions are due to intrinsic instabilities of the materials to be bonded. Any type of heat source can be used in practicing the invention, including resistive heating, inductive heating or heating with microwaves.

As a result of the materials to be bonded having different coefficients of thermal expansion, the maximum allowable heat treatment temperatures may be limited. Differences in thermal expansion between bonded components usually result in stresses if there is interdiffusion of species between the adjacent surfaces. These stresses can become strong enough to fracture the bonded components. Furthermore, even if catastrophic failure does not occur, the resultant stress can cause undesirable changes in the physical properties of the materials, for example in the materials' refractive indices. Therefore, a preferred embodiment of the present invention overcomes the formation of stresses by performing the heat treatment step below a temperature where interdiffusion occurs. At these temperatures very little stress is generated although the reasons for this phenomena are not well understood.

The length of time that the materials are exposed to the heat treatment step can be as short as a few minutes. The period of time depends upon the heat source used as well as the physical dimensions of the materials to be bonded. Furthermore, there is some tendency for bond strength to increase as the heat treatment is prolonged, assuming there are no side reactions. Obviously the ultimate required bond strength is driven by the intended application.

Heat treated composite structures can be subjected to all common finishing operations such as sawing, grinding, and polishing without adverse effects. If the interface is weak, for example due to the use of less-than-optimal matching surface figures, partial delamination can occur during further processing.

The composites of the present invention can consist of combinations of similar or dissimilar crystalline, vitreous or dense polycrystalline ceramic, metallic or organic polymeric components. Since interdiffusion at the interface is controlled by the heat treatment temperature, the original bulk properties can be maintained with minimal disturbance of the optical, electrical, thermal, or mechanical properties. The absence of any adhesive aids or defects at the interfaces of components bonded according to the present invention renders these composite constructs ideally suited for electro-optical and optical devices. Many constructs of the present invention are unique and can not be produced by any known techniques of the prior art.

Optical Waveguides

Waveguide structures of the present invention have the following advantages over the prior art:

(i) The present invention results in a reduction in the losses occurring at the interfaces, primarily those losses associated with scattering. Interfaces between guiding and nonguiding layers are of the same optical quality as polished surfaces and are flat to about $1/10$ of a wavelength of light. The resultant low losses provide much higher damage thresholds.

(ii) The present invention is applicable to a wide range of materials, for example: existing crystalline laser media such as Nd:YAG, GGG, GSGG, sapphire and YLF; non-linear optical crystals such as potassium titanyl phosphate (KTP) and its isomorphs; $LiNbO_3$, $KNbO_3$ and their isomorphs; potassium dihydrogen phosphate and its isomorphs; and nonlinear borate crystals.

(iii) The techniques of the present invention are applicable to high yield production quantities.

(iv) The present invention can be used with materials which exhibit a wide range of refractive indices, extending from fluoride crystals of about 1.33 refractive index for NaF to over 2 for $KNbO_3$ and $KTaO_3$.

(v) Multimode and single mode waveguides of precise dimensions can be fabricated using the present invention as well as square or rectangular buried channels. Dimensions for the guiding layers or cores of the order of about 4 μm to about 100–500 μm are possible.

(vi) The length of the waveguide structures fabricated using the present invention can be up to 100–200 mm. Similarly, one or two-dimensional arrays can be constructed.

(vii) Using the present invention waveguide structures can be bonded to other laser-active or inactive components, nonlinear optical crystals, optical fibers, beam launching modules, and laser pump modules in order to obtain a multifunctional device. The fabricated devices can also contain optical coatings at the interfaces.

Waveguide structures of the present invention allow the realization of the intrinsic advantages of solid state waveguide lasers over their bulk counterparts. Confinement of the mode volume by the small dimension of the laser-active region increases the product of the pump intensity and the interactive length. Quasi-3-level lasing transitions and upconversion can readily be saturated. Therefore, many more lasing transitions become accessible to lasing than is possible with bulk solid state lasers. Similar considerations hold for waveguide versus bulk nonlinear optical media where the concentration of laser radiation into the guiding layer results in increased efficiency of harmonic frequency conversion.

Many combinations for waveguide structures are conceivable and useful for specific electro-optical devices according to this invention. Only a few of the more commonly available materials are enumerated by way of example to demonstrate the wide scope of the invention.

Solid state waveguide lasers can be constructed from the following pairs of laser-active core or guiding layers, containing laser-active ions doped into their crystalline or amorphous network, and either single or double layers of cladding of undoped or differently doped components.

| Laser-Active Core or Guiding Layer | Cladding Layer or Layers |
|---|---|
| YAG | YAG, Sapphire |
| LuAG | Yag, LuAG |
| GSGG | GSGG, GGG, YAG, Sapphire |
| $YVO_4$ | $YVO_4$ |
| $GdVO_4$ | $YVO_4$ |
| $YLiF_4$ | $YLiF_4$, $CaF_2$, $MgF_2$ |
| $LuLiF_4$ | $YLiF_4$, $LuLiF_4$ |
| LiSAF | LiSAF |
| NYAB | YAB |
| S-FAP | S-FAP |
| Glass | Glass |

Nonlinear optical waveguides can be constructed from the following combinations of nonlinear-optical waveguiding cores or layers and cladding layers which are in either the same or different crystallographic orientations.

| Waveguiding Core or Layer | Cladding Layer or Layers |
|---|---|
| LiNbO$_3$ | LiNbO$_3$ |
| KNbO$_3$ | LiNbO$_3$, KNbO$_3$ |
| LiTaO$_3$ | LiNbO$_3$, LiTaO$_3$ |
| LBO | BBO |
| KTP | KTA |
| KTA | KTP |
| CsTP | KTP |

Configurations of waveguide structures according to the present invention are restricted to straight planar interfaces between guiding and cladding layers. Some other common waveguide structures are not possible due to the inability of producing cylindrical interfaces between the guiding and cladding layers. Similarly, the one-step fabrication of layered structures with a bend requires a degree of accuracy which is difficult to achieve since it involves the simultaneous optical contacting of two surfaces which enclose a non-zero angle with each other.

In order to obtain waveguide cores of low stress it is very important that the surfaces to be bonded have very accurate surface figures. The more the two surfaces conform to each other the less elastic deformation is necessary to bring them into optical contact, therefore leading to lower stress. Also of great importance is the reduction of subsurface damage. Subsurface damage such as micro-fissures are known to extend 50 to 100 micrometers into the polished surface. When the core is only tens of micrometers thick, it is desirable to maintain subsurface damage at as low a level as possible by carefully removing most subsurface damage introduced during the previous finishing step. The level of stress in the core is also dependent on the waveguide configuration. Sandwich-type structures appear to exhibit less stress than channel-type structures. Heat treatment of waveguide structures is kept close to the lower level of the operable temperature range to avoid introduction of stress and scatter at the interfaces. It is also possible to fabricate structures in which the core exhibits uniaxial stress, resulting in polarization maintaining waveguide structures.

FIGS. 3A–H illustrate some simple waveguide configurations according to the present invention. In the following cases the input and output faces are precision polished and the appropriate optical coatings are deposited after the composite has been fabricated. The thickness of the guiding layer depends upon the intended application, ranging from about 500 micrometers for multimode operation to about 4 micrometers for single mode operation. Device 305, a simple planar structure which may be used for concentrating laser radiation, consists of a guiding layer 306 of a nonlinear optical crystal bonded to a substrate 307 of lower refractive index. Device 310 is a similar device with a wedge-shaped guiding layer 311, thus further concentrating the laser radiation passing through it. Device 315, a planar waveguide structure with a guiding layer 316 sandwiched between two cladding layers 317, requires two bonds according to the present invention. Device 320 is a wedge-shaped sandwich. Devices 325 and 330 are examples of devices with three bonds. Waveguide structures 335 and 340 have buried cores of square and rectangular cross sections, respectively. Rhombohedral or hexagonal cross sections (not shown) are also possible and may have advantages in some circumstances but are usually restricted to thicknesses of about 300 to 600 micrometers.

Waveguiding configurations consisting of combinations between laser-inactive and laser-active layers are illustrated in FIGS. 4A–H. Since waveguide lasers are usually end-pumped, an important feature of the present invention is realized by bonding undoped sections 401 of the corresponding undoped material to both ends of a core 402 as illustrated by device structures 405 and 410. This construct provides a means of conducting the heat of absorption of the incident pump radiation away from the doped section of the core and avoids overheating the optical coatings of the device, thereby increasing the capabilities for high power laser operation without damage to the optical coatings. Undoped end sections 401 in device structures 415 and 420 concentrate pump radiation. They are fabricated separately from the laser-active waveguide module and subsequently bonded to it. Device structure 425 has a core consisting of an undoped end section 426, a passive Q-switch 427, a laser-active section 428, and an undoped end section 429, all of which are bonded together. For example, such a structure could be composed of undoped YAG, Cr$^{4+}$:YAG, Nd:YAG, and undoped YAG, respectively. Device structure 430 shows a composite which is useful when the thermal conductivity of the electro-optical material is not sufficiently high to conduct the absorbed pump radiation away, even with undoped end sections. Structure 430 consists of sections 431, 432, and 433 of varying dopant concentrations along with undoped end sections 434. The sections are bonded together using the techniques of the present invention. Typically section 431 would be of a lower dopant concentration than section 432, and the concentration in section 433 would be equal to or different from the concentration in 431. Waveguide structure 435 has a double layer of claddings where the refractive index of inner cladding 436 is higher than that of outer cladding 437, but lower than that of the core 438. This type of device may be used to guide pump radiation into the core by end pumping. An array of laser-active or inactive waveguides can be constructed, as illustrated by device 440. Although device 440 is a one-dimensional array, two-dimensional arrays are equally feasible. Structures where the core of the waveguide is hollow and the walls are of optical quality in surface figure and smoothness are also feasible by the same techniques of composite formation according to the present invention. These examples illustrate the wide range of device configurations, and should not be considered to limit the scope of the invention.

Combinations of Doped and Undoped Electro-Optical Materials

FIGS. 5A–H illustrate a wide range of useful and novel lasing components of solid state laser systems fabricated according to the present invention. Undoped and doped sections are bonded together below the temperature region where substantial interdiffusion between the surfaces forming the interface is believed to occur. The lower treatment temperature circumvents problems associated with phase transitions, appearance of latent scratches, and stress birefringence. The composite cores of waveguide laser devices 425 and 430 are analogous to generic configurations 505 and 510. The features and functions of the undoped end section(s) include: (i) providing a heat sink for end- or side-pumped laser operation, thereby protecting the optical coatings from overheating; (ii) eliminating ground state absorption losses in quasi-three-level laser systems by allowing the entire lasing medium to be pumped, resulting in improved efficiency and less heat generation; (iii) avoiding thermal distortion of the rod or slab ends, resulting in improved beam quality; (iv) insuring that the pumped region and the mode volume of the laser rod are congruent by confining dopant ions to the region which is traversed by the laser mode (deviations from this condition usually result in large efficiency losses in the laser cycle as well as contributing to waste heat); (v) increasing the length of small components by adding one or more functional undoped sections so that they can be more conveniently fabricated or handled; and (vi) avoiding spatial hole burning in overlap regions of laser beams inside a laser cavity.

The basic composite design of a doped rod 501 with undoped end sections 502 is illustrated by device 505. Structure 510 illustrates a composite where a long laser rod is constructed by bonding two core-drilled rods 512 on end together to obtain a symmetric gradient of dopant concentration in a rod length. Not only would a similar construct using the prior art fabrication techniques be very expensive, the prior art based rod cannot yield equivalent quality. Undoped end sections 514 further improve laser operation in this device. Device structure 515 is a composite rod consisting of doped sections 517 of different concentrations, thus permitting the user to design a desirable pattern of pump radiation absorption. The present invention also allows the design of solid state laser components which have more than one function. For example, structure 520 is a YAG laser chip containing undoped ends 521, a $Cr^{4+}$:YAG slab 522 as a passive Q-switch, and a Nd:YAG slab 523 as the lasing medium. A composite rod consisting of undoped ends 525 and a cladding 526 surrounding a core 527 of hexagonal cross section is depicted in device 530. It is obvious that the fabrication of a clad rod with polygonal cross section may also yield many thin disks with a clad central section just by slicing a rod such as that of device 530 into sections of desired thickness. The improved thermal uniformity due to the cladding improves the beam pointing stability of the laser operation. Composite slabs with undoped ends only or undoped ends and cladding or cladding only are represented by devices 535, 540, and 545, respectively. The advantages of such devices over the prior art are analogous to those of composite rods. Differences between composite configurations for cores of waveguide lasers and for the devices with claddings shown in FIGS. 5A–H are mainly in terms of dimensions, with the waveguide lasers having a cladding of lower refractive index bonded to their laser-active core. Many other useful composite configurations are possible for laser rods, laser slabs and laser chips. FIGS. 5A–H only show a few of the possibilities.

The essentially flawless interface of these composite constructs enables their use as jewelry. Crystals of different colors, dopants, dopant concentrations, and/or refractive indices can be bonded by the techniques of the present invention as sandwich structures or as claddings, and attain aesthetic effects which cannot be achieved by any prior art. Crystals may be synthetic or naturally occurring sapphire, diamond or other crystalline or glass materials known for their aesthetic value as jewelry.

Thermal Management of Device Structures

Operation of electro-optical devices usually generates waste heat which can degrade or limit the device performance. Therefore, an important advantage of the present invention is providing a means of conducting waste heat away with insulating or otherwise non-active crystals which have high thermal conductivities. A variety of cooling mechanisms have been employed in the prior art, such as metal blocks as heat sinks or electrically insulating thermally conducting wafers bonded to an active semiconductor device. The present invention provides a composite between a wafer of semiconducting crystal such as silicon, indium phosphide, gallium arsenide, gallium phosphide, gallium nitride, zinc selenide, silicon carbide or others, and a thermally conducting substrate crystal with an interface which is both optically and thermally transparent. Using the present invention the interface is defect free, thus eliminating undesirable scatter as well as reduced heat transfer. Combining a number of semiconducting monocrystalline wafers into a multifunctional stack is equally possible according to the present invention, with essentially perfect electrical contact between the different layers. The thermally conducting insulating layers can be fabricated from sapphire, garnet, diamond, or other suitable crystal, depending on the specific thermal requirements of the device. The wafer composite is strong enough to be subjected to any thinning or other processing steps required to obtain an operational device. Similarly, lamellae or sections of sapphire, garnet, or diamond can also be employed for conducting heat flow away from solid state laser or nonlinear optical devices, e.g. for harmonic frequency conversion, since many electro-optically useful crystals also have low thermal conductivity. The specific design of the thicknesses of heat-removing lamellae depends on the two materials to be bonded and their intended function but, in general, thermal end effects can be avoided by having the thickness as large as the diameter of the rods.

Figure 6A:
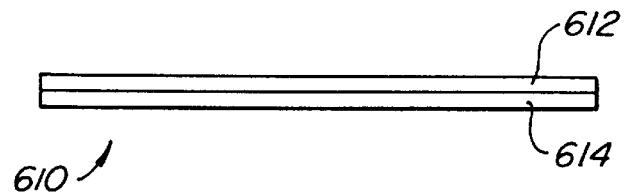
FIGS. 6A–D illustrate several composite structures in which heat sinks have been bonded to active devices.
Figure 6B:
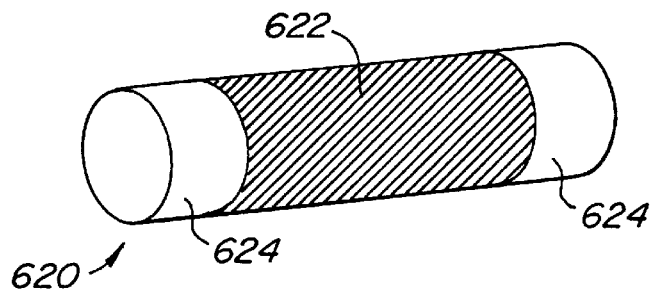
Figure 6C:
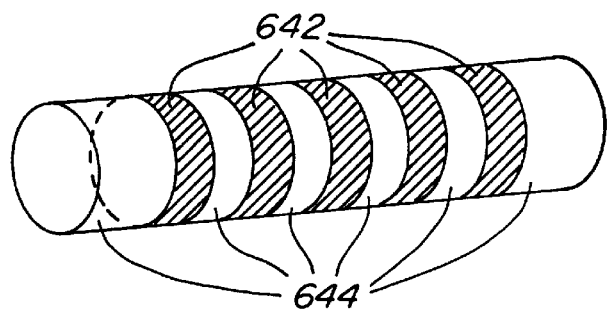
Figure 6D:
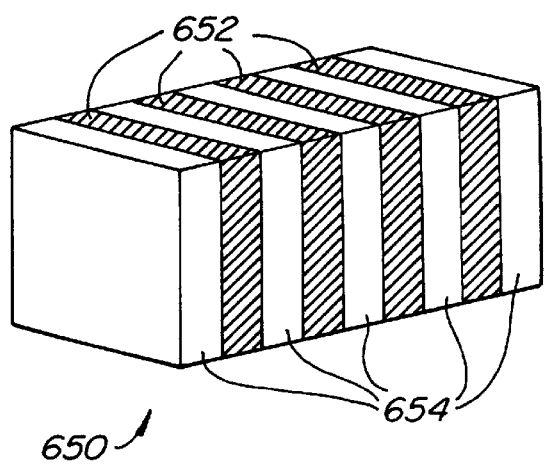

Structure 610 shown in FIG. 6A illustrates the simplest type of composite configuration between a semiconducting or otherwise electro-optically active wafer-like structure 612 and a monocrystalline highly thermally conducting, electrically insulating substrate 614. The electro-optically active monocrystalline layer may consist of semiconducting silicon, gallium arsenide, gallium phosphide or other crystal of the zinc blende structure. It may also consist of a wafer of a laser-active material such as doped YLF, $YVO_4$, or LiSAF bonded to sapphire, YAG or diamond, which can then be diced into composite microchip devices. Structure 620 of FIG. 6B illustrates a preferred laser rod geometry, consisting of a laser-active rod 622 of a material such as YLF, $YVO_4$, or LiSAF with non-lasing end sections 624 of YAG or sapphire attached to it by the technique of the present invention. Optical coatings can be deposited on the sections prior to composite formation. Structure 640 of FIG. 6C demonstrates another preferred composite rod geometry consisting of alternating layers of laser active material 642 and inactive crystalline material 644. This configuration is especially useful for end pumped solid state lasers where the radial thermal gradient can be reduced substantially and only an axial thermal gradient is left which does not deteriorate beam quality. This geometry results in much improved beam quality over solid state laser rods of the prior art. Structure 650 of FIG. 6D is a preferred structure for nonlinear optical devices for harmonic frequency conversion. Layers of nonlinear optical crystals 652 such as KTP or BBO in the correct crystallographic orientation for the desired type of harmonic conversion alternate with layers 654 of sapphire or YAG. Many other configurations are possible which are effective for thermal management of electro-optical devices.

Quasi-Phase-Matched Stacks of Nonlinear Optical Materials

Since interdiffusion at the interface between lamellae of nonlinear optical semiconducting materials of the zinc blende structure results in an interface of modified nonlinear optical properties, a condition for producing phase-matched stacks of these crystals is to avoid diffusion or any other form of mass transfer between lamellae. The method of bonding by the present invention provides a means of achieving a strong bond between adjacent layers without modifying the nonlinear optical properties of the bulk which are a prerequisite of efficient harmonic frequency conversion. Similarly, the present invention provides a means of obtaining interfaces which are free of scatter and gaseous and solid inclusions at the interface. Thus, precision polished, essentially defect-free surfaces with low subsurface damage are optically contacted with each other, and the requirements of the prior art of heat treatment at elevated temperatures to effect diffusion bonding and the creation of a heterostructure at the interface is eliminated according to the present invention.

Optical Coatings at Interfaces

The present invention is ideally suited for obtaining a permanent strong bond between two components where a coating is deposited on at least one of the surfaces to be bonded prior to bonding. Furthermore, due to the low temperatures required for bonding according to the present invention, optical coatings may also be applied to surfaces other than those to be bonded prior to bonding. The coatings considered in this section are designed to enhance the performance of the devices under consideration and are not required to facilitate bonding.

When a coating is deposited on one of the surfaces to be bonded, it may be necessary to precision polish the coated surface prior to optically contacting the components. If it appears that the performance of the coating may suffer from the polishing step, a sacrificial outer layer (e.g., an oxide or magnesium fluoride layer) may be added to the coating which is at least partially removed during surface preparation. The thickness of the sacrificial layer can be readily controlled by the deposition conditions. There are several possible methods of controllably removing the sacrificial coating layer. First, the removal rate of the sacrificial layer can be established on sample pieces. Second, a polishing medium may be selected which readily removes one type of coating while being relatively inert to a different type of coating. For example, an aqueous high purity ceria suspension will completely remove a fluoride coating such as magnesium fluoride without affecting an underlying oxide layer such as alumina, silica, or zirconia. Third, the polishing step can be periodically interrupted thereby allowing the functionality of the coating as well as its surface figure to be determined. An alternate approach is to deposit a multilayer coating with a sufficient number of layers that removal of a few of them has no substantial effect on its performance. Although all of the approaches are viable, the last one is easiest from the viewpoint of surface preparation.

The use of optical coatings at interfaces dramatically increases the applicability of the present invention to optical and electro-optical devices. Materials can now be chosen based on their device properties without consideration of the potential reflective losses at the interfaces. By eliminating the airspace between components of different functionality and refractive index, more compact and vibrationally stable devices can be fabricated. Furthermore, these composite devices are generally easier to mount and more reliable. The orientational adjustment of components with respect to each other is completely eliminated by joining them in the correct orientation.

Figure 7A:
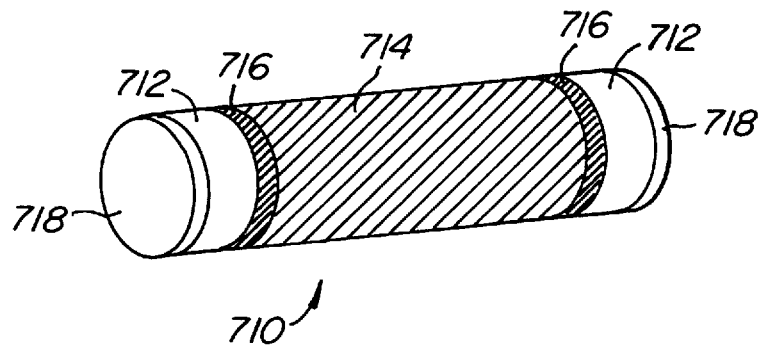
FIGS. 7A–C illustrate a variety of composite devices containing optical coatings at the interfaces.

One application of optical coatings according to the present invention is to minimize reflections at the interface between two materials of different refractive indices. Typically this is accomplished using an antireflective coating designed to facilitate the transition from a material of index $n_1$ to a material of index $n_2$. In this manner, a material of high thermal conductivity and index $n_1$ can be combined with a material of low thermal conductivity of index $n_2$ without reflective losses at the interface. Device structure 710 shown in FIG. 7A illustrates this concept. In device 710 sapphire end sections 712 are bonded to a Nd:YLF section 714 using the technique of this invention. Prior to bonding, an antireflection coating 716 is applied to the ends of section 714. If desired, coatings 718 can also be applied to end sections 712 prior to bonding.

Figure 7B:
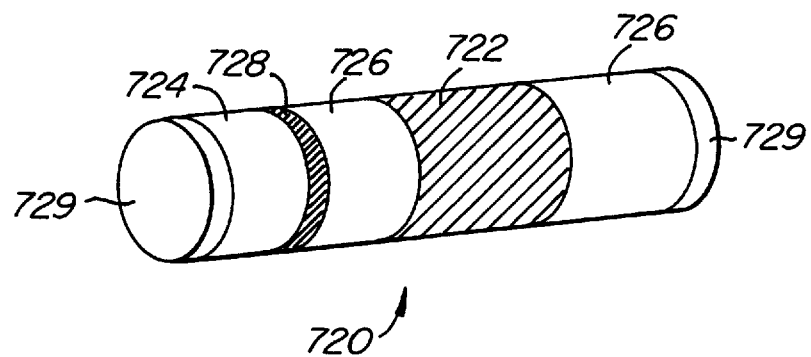

According to the present invention, interface optical coatings can be applied which replace conventional index matching fluids. An optical coating at the interface between a laser-active or inactive crystal and a nonlinear optical crystal for harmonic frequency conversion acts as a transition between these two crystals of different refractive indices. For example, KTP and YAG are commonly employed as a frequency doubling crystal and as a solid state laser source, respectively, operating at 1.064 micrometers. Although they can be joined without an optical coating, reflective losses at the interface make an optical coating desirable to eliminate these losses. Structure 720 shown in FIG. 7B is an example of combining a Nd:YAG laser crystal 722 with a KTP crystal 724. In this structure lasing section 722 is bonded to undoped YAG end sections 726. An optical coating 728 is at the interface between the laser crystals (i.e., 726/722/726 combination) and the nonlinear optical crystal 724. Coatings 729 are optional end coatings. Device 720 can be assembled from the individual components in one single step, or it can be gradually assembled, testing the functions of each component after partial assembly according to the present invention.

Figure 7C:
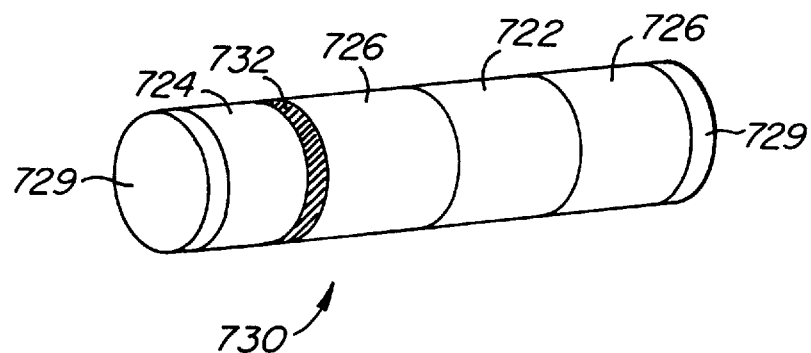

Device 730 shown in FIG. 7C is a composite solid state laser device for extracavity frequency doubling. Although the individual crystals are of the same type as used in device 720, the optical coating at the interface is chosen to define the cavity differently. Interface coating 732 is designed to reflect the pump radiation of 810 nanometers, provide a transmission of 3 percent of the fundamental laser wavelength of 1.064 micrometers, and keep the frequency doubled wavelength in the doubling crystal by having the coating also reflect 0.532 micrometers.

Optical Components

The present invention can be used to fabricate multi-element optical components, with or without optical coatings at the interfaces. In particular, the low temperatures of heat treatment in conjunction with the scatter-free interfaces and the possibility of joining similar or dissimilar materials both with and without optical coatings at the interfaces, are all features of the present invention which allow the design and production of a wide range of optical components which have been inaccessible by the prior art. For example, optical component 810 shown in FIG. 8A is a doublet lens, joined by the techniques of the present invention. The resultant optical element is compact, stable, and resistant to intense laser radiation passing through it. The outside surfaces of lens 812 can be aspheric, spherical or plano. Interface 814 is usually plano although it can be spherical or even aspheric if the surfaces are generated and polished with sufficient accuracy and surface smoothness that they can be optically contacted.

Optical elements 815 and 820 shown in FIGS. 8B–C illustrate compact anamorphic optical elements bonded according to the present invention. Component 815 illustrates the combination of a prism 821 and a cylindrical lens 822 while component 820 illustrates the combination of prism 821 to a spheric or aspheric lens 823. The individual elements of these optical components can be the same or different; can consist of glasses or crystals; and can be coated or uncoated. Optical element 825 of FIG. 8D is a plano-concave lens 826 bonded to a plano-convex aspheric lens 827. Beam splitters 830 and etalons 835 shown in FIGS. 8E–F can also be fabricated using the techniques of the present invention. These elements are completely resistant to indiffusion over time and do not suffer any type of deterioration over time. Structures 840 and 845 of FIGS. 8G–H illustrate arrays of cylindrical lenses constructed according to the present invention. While structures 840 and 845 show arrays of 5 and 10 lenses, respectively, the invention is not so limited. For example, an array of 50 lenses can also be made using these techniques. Arrays of this nature are useful for collecting and directing pump radiation from laser diode arrays onto a solid state laser component. The present invention is also capable of producing recessed optical surfaces, as illustrated in structures 850 and 855 of FIGS. 8I–J, which find application as hollow waveguides or as guides or alignment aids for optical fibers. Device 850 is a sensor head of sapphire which can be used with a miniature sized spectrophotometer. Device 850 has a capillary space for an optical fiber carrying a probe beam, a cell with parallel optical surfaces, and a prism to redirect the probe beam into an outgoing optical fiber for analyzing the spectrum of the liquid in the cell. Other optical components according to the present invention are composite optical filters. By way of example, they may consist of polarizing crystal or glass components and components which absorb specific spectral bands and are combined into multifunctional filters for the ultraviolet to the infrared spectral region.

Bonded Optical Fibers

Low loss due to scatter and reflection at interfaces is critical for connecting optical fibers with each other or with the input or output surfaces of devices. The present invention is well suited to obtain these connections without the aid of any adhesives. Typically, due to the sizes of he fibers involved, alignment aids are required during polishing and optical contacting. These aids can be removed after bonding or left in place to add additional mechanical stability to the joint.

Multilayer Wafer-Type Composites

Several of the afore described composites may be comprised of several layers. For example, both the quasi-phase-matched stacks and the waveguide structures may consist of a number of layers. The layers may be either simultaneously or sequentially assembled, or some combination of these two processes may be used.

In order to simultaneously assemble a stack of wafers, the faces of all of the wafers should be parallel and of the correct thickness. This helps to avoid systematic errors such as wedge formation. Typically wafers on the order of 100 micrometers or less are used with this fabrication process.

Although the simultaneous fabrication process minimizes the number of heat treatment steps, thus reducing the number of processing steps, the possibility of obtaining one or more inadequate interfaces increases with the number of wafers. This possibility can be minimized by determining interferometrically the optical homogeneity of the stack after assembly and before heat treatment. However, it is generally quite difficult to identify and repair the faulty interfaces without disassembling the entire stack, thus increasing the likelihood of damaging at least one of the prepared surfaces.

An alternative to the simultaeous fabrication process is to sequentially form the bonds, thereby allowing further surface preparation between individual processing steps. For example, in order to prepare a composite with eight wafer layers, four doublets could first be prepared. The doublets would be fabricated according to the previously described process including all surface preparation and heat treatment steps. After the four doublets were prepared, one surface of each doublet would be repolished and prepared for bonding. The newly prepared surface of each doublet would then be bonded to the newly prepared surface of another doublet, resulting in the fabrication of two quadruplets. Once again, the surfaces to be contacted for each quadruplet would be prepared and a final bonding step would be performed. This process is not limited to an eight layer stack, but instead could be used to prepare stacks of any desired number of layers.

There are several benefits to the sequential approach. First, if one interface is irreparably damaged, the entire stack is not lost. Rather, only a limited portion of the stack is lost. Second, each interface can be individually checked interferometrically prior to heat treatment, thus allowing an individual interface to be disassembled, repolished, and reassembled with a minimum impact on other wafers. Third, individual layers need not be polished to the final desired thickness at the time of initial assembly thus making handling and preparation easier. For example, assuming that it is desirable to have a stack of 8 wafers, each 0.1 micrometers thick, using this technique the initial doublets could be formed with much thicker wafers. Then, after the doublets have been formed, one wafer of each doublet can be polished down to the desired thickness. At this point in time each doublet would consist of a wafer that is at its final desired thickness and a wafer which is much thicker than the final desired thickness. The surfaces of the newly polished wafers can now be bonded together. Next the outer wafers of each quadruplet which are thicker than desired can be thinned to their final thickness. Thus after bonding the two quadruplets together each of the wafers would be of the desired thickness.

As will be understood by those familiar with the art, the present invention may be embodied in other specific forms without departing from the spirit or essential characteristics thereof. Accordingly, disclosure of the preferred embodiment of the invention is intended to be illustrative, but not limiting, of the scope of the invention which is set forth in the following claims.

I claim:

1. An optical element with an optical interface exhibiting negligible scatter prepared by a process comprising the steps of:

(a) optically contacting surfaces of first and second single crystal materials to form an assembly comprising said optical interface, wherein said first and second single crystal materials have different melting temperatures, and wherein said optically contacted surfaces are indicated by a complete disappearance of interference fringes at said optical interface;

(b) bonding said optically contacted surfaces of step (a), by gradually heating said surfaces to a temperature below the fusion temperature of said surfaces, but at a temperature and for a time sufficient to diffusion bond said surfaces of said first and second materials; and (c) cooling the bonded structure of step (b) at a rate which allows the removal of stress by annealing, wherein a bonding agent or bonding film is not present between said bonded first and second single crystal materials.

2. The optical element of claim 1, wherein said bonding temperature of step (b) is a temperature corresponding from about 0.4 to about 0.9 times the value of the lower of the respective material's melting temperature.

3. The optical element of claim 1, wherein said first single crystal material is a Nd crystal and said second single crystal material is a YAG crystal.

4. An optical element comprising at least one optical interface, wherein said interface is defect free and exhibits negligible optical scatter, and wherein said interface permanently bonds a first material to a second material without the use of a bonding agent, wherein said first and second materials are dissimilar, and wherein said interface is formed by a process comprising the steps of:

precision polishing a surface of said first material and a surface of said second material;

optically contacting said surfaces of said first and second materials to form said interface, wherein a complete disappearance of interference fringes at said interface indicates optically contacted surfaces;

heating said optically contacted surfaces to stabilize said bonded interface, said heating step at a temperature above 80° C. and below a fusion temperature; and cooling said bonded surfaces.

5. The optical element of claim 4, wherein said interface is free of trapped gas or fluid.

6. The optical element of claim 4, wherein at least one of said materials is a glass.

7. The optical element of claim 4, wherein at least one of said materials is crystalline.

8. The optical element of claim 4, wherein at least one of said surfaces is coated with an optical coating prior to forming said interface.

9. The optical element of claim 4, wherein said optical element is a waveguide and said first material is a guiding layer and said second material is a cladding material.

10. The optical element of claim 4, wherein at least one of said materials is doped.

11. The optical element of claim 4, wherein the main function of one of said materials is to conduct heat away from the other of said materials.

12. The optical element of claim 4, wherein said first and second materials are nonlinear optical crystals and said optical element is a quasi-phase-matched stack used for frequency conversion.

13. The optical element of claim 12, wherein said nonlinear optical crystals have defined crystallographic orientations of the zinc blende structure.

14. The optical element of claim 4, wherein said optical element is a multi-element optical component and said first and second materials are first and second optical members.

15. The optical element of claim 4, wherein said first material is a first fiber and said second material is a second fiber.

* * * * *